United States Patent
Kageyama et al.

(10) Patent No.: US 7,801,198 B2
(45) Date of Patent: Sep. 21, 2010

(54) SURFACE EMITTING LASER ELEMENT AND METHOD OF FABRICATING THE SAME

(75) Inventors: Takeo Kageyama, Tokyo (JP); Norihiro Iwai, Tokyo (JP); Yasumasa Kawakita, Tokyo (JP); Keishi Takaki, Tokyo (JP); Peter Nyakas, Budapest (HU)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/057,538

(22) Filed: Mar. 28, 2008

(65) Prior Publication Data

US 2008/0240192 A1    Oct. 2, 2008

(30) Foreign Application Priority Data

Mar. 29, 2007   (JP) ............................. 2007-089420

(51) Int. Cl.
*H01S 5/00* (2006.01)
(52) U.S. Cl. .................. 372/50.124; 372/49.01
(58) Field of Classification Search .................. 372/99, 372/50.124; 438/47; 257/13
See application file for complete search history.

(56) References Cited

U.S. PATENT DOCUMENTS

| | | | |
|---|---|---|---|
| 5,111,467 A * | 5/1992 | Bradley | 372/32 |
| 5,568,504 A * | 10/1996 | Kock et al. | 372/96 |
| 5,978,141 A | 11/1999 | Karwacki | |
| 6,031,243 A * | 2/2000 | Taylor | 257/13 |
| 6,046,065 A | 4/2000 | Goldstein et al. | |
| 6,330,265 B1 * | 12/2001 | Kinoshita | 372/50.12 |
| 6,341,137 B1 * | 1/2002 | Jayaraman et al. | 372/50.1 |
| 6,556,607 B1 * | 4/2003 | Jewell | 372/49.01 |
| 6,980,579 B2 * | 12/2005 | Jewell | 372/96 |
| 7,245,647 B2 | 7/2007 | Jikutani et al. | |
| 7,560,298 B2 * | 7/2009 | Lipson | 438/44 |
| 7,590,159 B2 | 9/2009 | Jikutani et al. | |
| 2006/0062266 A1 * | 3/2006 | Jewell | 372/43.01 |
| 2006/0093010 A1 | 5/2006 | Sekiya et al. | |
| 2007/0014324 A1 | 1/2007 | Maeda et al. | |

FOREIGN PATENT DOCUMENTS

| JP | 2004-103754 | 4/2004 |
|---|---|---|
| JP | 2004-207380 | 7/2004 |

OTHER PUBLICATIONS

Hyun-Eoi Shin, et al. "High-finesse $Al_xO_y$/AlGa As nonabsorbing optical cavity" Appl. Phys. Lett., vol. 72, No. 18, May 4, 1998, pp. 2205-2207.

* cited by examiner

*Primary Examiner*—Minsun Harvey
*Assistant Examiner*—Tuan Nguyen
(74) *Attorney, Agent, or Firm*—Oblon, Spivak, McClelland, Maier & Neustadt, L.L.P.

(57) ABSTRACT

A surface emitting laser element includes an active layer and a dielectric multilayer mirror formed with a plurality of dielectric layers having different refractive indices for reflecting a light generated in the active layer. At least one of boundaries between the dielectric layers is formed to have a predetermined surface roughness to obtain a desired target reflectance of the dielectric multilayer mirror.

4 Claims, 2 Drawing Sheets

SURFACE EMITTING LASER ELEMENT AND METHOD OF FABRICATING THE SAME

CROSS-REFERENCE TO RELATED APPLICATIONS

The present application claims priority to and incorporates by reference the entire contents of Japanese priority document 2007-089420 filed in Japan on Mar. 29, 2007.

BACKGROUND OF THE INVENTION

1. Field of the Invention

The present invention relates to a surface emitting laser element that includes an active layer and a dielectric multilayer mirror and a method of fabricating the surface emitting laser element.

2. Description of the Related Art

A vertical cavity surface emitting laser (VCSEL) element has been used as a light source for optical communications such as an optical interconnection or a device for various applications (see, for example, Japanese Patent Application Laid-open No. 2004-207380). A plurality of VCSEL elements can be arranged in a two-dimensional array on a single substrate more easily than edge-emitting laser elements, because each VCSEL element emits a laser light in the vertical direction with respect to the substrate. Moreover, the VCSEL element has preferable properties, due to a compact-sized active layer, such as extremely low threshold current and laser oscillation at low consumption power.

In a typical VCSEL element, a distributed Bragg reflector (DBR) mirror is used in a resonator. It has been widely known that a DBR mirror formed with a plurality of dielectric layers having different refractive indices (hereinafter, "dielectric DBR mirror") can reduce optical absorption loss, so that it is possible to obtain a high-power laser source. There have been developed VCSEL elements including the dielectric DBR mirror in a resonator (see, for example, Japanese Patent Application Laid-open No. 2004-103754). Reflectance of the dielectric DBR mirror depends on the number of dielectric layers, and therefore laser output characteristics of the VCSEL element including the dielectric DBR mirror depends on the number of the dielectric layers.

However, the reflectance of the dielectric DBR mirror changes by a large amount with increase or decrease of the number of dielectric layers, because the refractive index difference between of the dielectric layers is large. This makes it difficult to obtain a dielectric DBR mirror with desired reflectance. Therefore, it is difficult to fabricate a VCSEL element including the dielectric DBR mirror in the resonator with desired laser output characteristics.

SUMMARY OF THE INVENTION

It is an object of the present invention to at least partially solve the problems in the conventional technology.

According to an aspect of the present invention, there is provided a surface emitting laser element including an active layer and a dielectric multilayer mirror formed with a plurality of dielectric layers having different refractive indices for reflecting a light generated in the active layer. At least one of boundaries between the dielectric layers is formed to have a predetermined surface roughness to obtain a desired target reflectance of the dielectric multilayer mirror.

Furthermore, according to another aspect of the present invention, there is provided a method of fabricating a surface emitting laser element that includes an active layer and a dielectric multilayer mirror formed with a plurality of dielectric layers having different refractive indices for reflecting a light generated in the active layer. The method includes forming a predetermined surface roughness on at least one of boundaries between the dielectric layers to obtain a desired target reflectance of the dielectric multilayer mirror.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are described in detail below with reference to the accompanying drawings.

Figure 1:
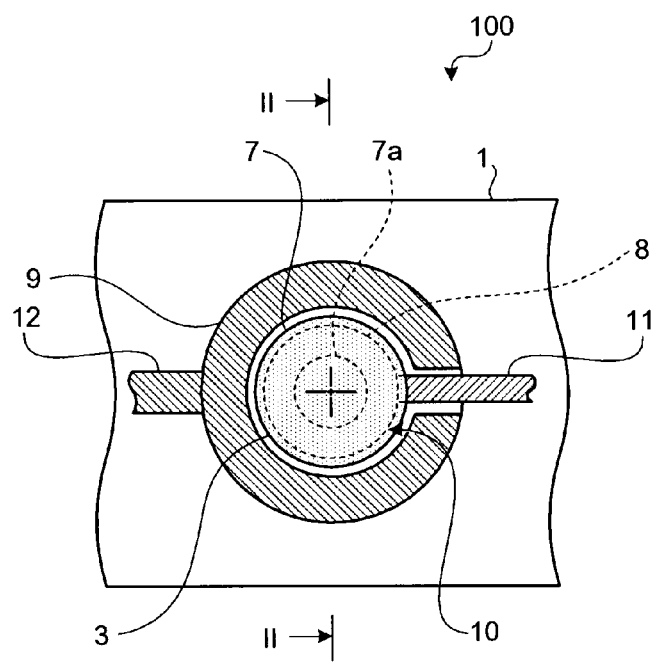
FIG. 1 is a top view of a VCSEL element according to an embodiment of the present invention.
Figure 2:
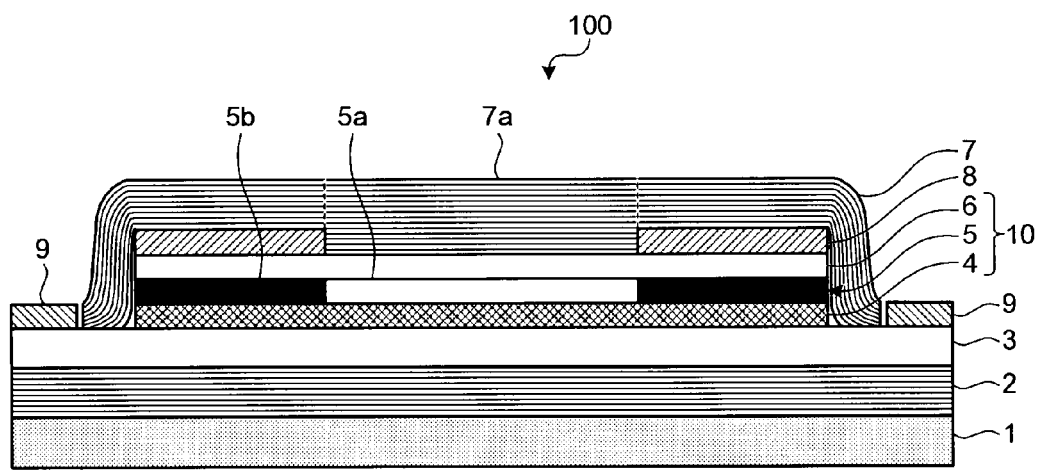
FIG. 2 is a cross section of the VCSEL element taken along a II-II line shown in FIG. 1.

FIG. 1 is a top view of a VCSEL element 100 according to an embodiment of the present invention. FIG. 2 is a cross section of the VCSEL element 100 taken along a II-II line shown in FIG. 1. As shown in FIGS. 1 and 2, the VCSEL element 100 includes a lower DBR mirror 2, an n-type cladding layer 3, an active layer 4, a current confinement layer 5, a p-type cladding layer 6, an upper DBR mirror 7, a p-type electrode 8, and an n-type electrode 9 those formed on a semi-insulating substrate 1. The active layer 4, the current confinement layer 5, and the p-type cladding layer 6 are formed on the n-type cladding layer 3 by etching or the like as a columnar mesa post 10.

The lower DBR mirror 2 is formed with a plurality of layers of compound semiconductors such as AlAs/GaAs. Thickness of each of the layers forming the lower DBR mirror 2 is $\lambda/4n$, where $\lambda$ is oscillation wavelength and n is refractive index. The upper DBR mirror 7 is formed with a plurality of layers of dielectric materials such as $SiN/SiO_2$, with predetermined reflectance.

The current confinement layer 5 includes an opening 5a and a selectively oxidized layer 5b. The current confinement layer 5 is formed with an Al-containing layer such as an AlAs layer. The selectively oxidized layer 5b is formed in a ring shape by oxidizing a predetermined range of the Al-containing layer from the outer circumference along the growth plane. The selectively oxidized layer 5b has an insulating property, and confines a current from the p-type electrode 8 inside the opening 5a to increase the current density of the active layer 4 under the opening 5a.

The active layer 4 of, for example, GaInNAs/GaAs has a three-layered quantum-well structure. The active layer 4 generates a spontaneous emission light due to the current injected from the p-type electrode 8 and confined by the current confinement layer 5. The spontaneous emission light is amplified by the resonator between the lower DBR mirror 2 and the upper DBR mirror 7 in a direction perpendicular to the layers including the active layer 4, and the amplified light is emitted as the laser light through an aperture 7a. The aperture 7a is a circular area formed on an upper surface of the upper DBR mirror 7 above the opening 5a.

The p-type electrode 8 is formed on the p-type cladding layer 6 in a ring shape surrounding a portion of the upper DBR mirror 7 above the opening 5a along the growth plane. The p-type cladding layer 6 is made of, for example, p-GaAs. The n-type electrode 9 is formed on the n-type cladding layer 3 in a C-shape surrounding a bottom portion of the mesa post 10 along the growth plane. The n-type cladding layer 3 is made of, for example, n-GaAs. The p-type electrode 8 and the n-type electrode 9 are electrically connected to an external circuit (e.g., current supply circuit, not shown) with a p-type lead electrode 11 and an n-type lead electrode 12, respectively.

As shown in FIG. 1, the upper DBR mirror 7 is formed on a predetermined area to cover the mesa post 10 that has a circular cross section parallel to the growth plane. As shown in FIG. 2, the upper DBR mirror 7 is formed from an upper surface of the p-type electrode 8 to an upper surface of the n-type cladding layer 3 covering side surfaces of the mesa post 10.

The boundary between dielectric layers forming the upper DBR mirror 7 has the substantially same surface roughness so that the upper DBR mirror 7 can obtain a target reflectance for the laser light. The reflectance at the boundary is defined by $$R_s R_0 \exp(-(4\pi\sigma n/\lambda)^2) \quad (1)$$

where $R_s$ is reflectance at the boundary, $R_0$ is reflectance when the surface roughness is zero, $\sigma$ is surface roughness, n is refractive index of the dielectric layer, and $\lambda$ is wavelength of the laser light emitted from the VCSEL element 100.

It is widely known that the reflectance of the upper DBR mirror 7 is calculated from a transfer matrix defined by configuration conditions including the number of the dielectric layers and the reflectance at each boundary between the dielectric layers (see, for example, "High-finesse $Al_xO_y$/AlGaAs nonabsorbing optical cavity", Appl. Phys. Lett., No. 18, Vol. 72, pp. 2205-2207, 1998). If the target reflectance of the upper DBR mirror 7 is decided, the reflectance $R_s$ can be calculated from the target reflectance of the upper DBR mirror 7 using an inverse matrix of the transfer matrix. Then, the reflectance $R_s$ can be calculated by using Equation (1) and the surface roughness $\sigma$. The upper DBR mirror 7 includes a plurality of layers with each boundary having the surface roughness $\sigma$ calculated as described above. The surface roughness can be represented by various index values. The surface roughness used in Equation (1) is represented by root-mean-squared (RMS) roughness. RMS roughness can be experimentally measured by atomic-force-microscopy (AFM) for the surface of the device such as a top of the dielectric mirror. On the other hand, the RMS of the each interface between dielectric mirrors can be evaluated by taking the cross-sectional image. The interface roughness can be clarified by the cross-sectional Transition electron microscopy (TEM) measurement. Focused ion beam-Secondary ion microscope (FIB-SIM) or Focused ion beam-Secondary electron microscope (FIB-SEM) can also be used to evaluate the interface roughness.

Figure 3:
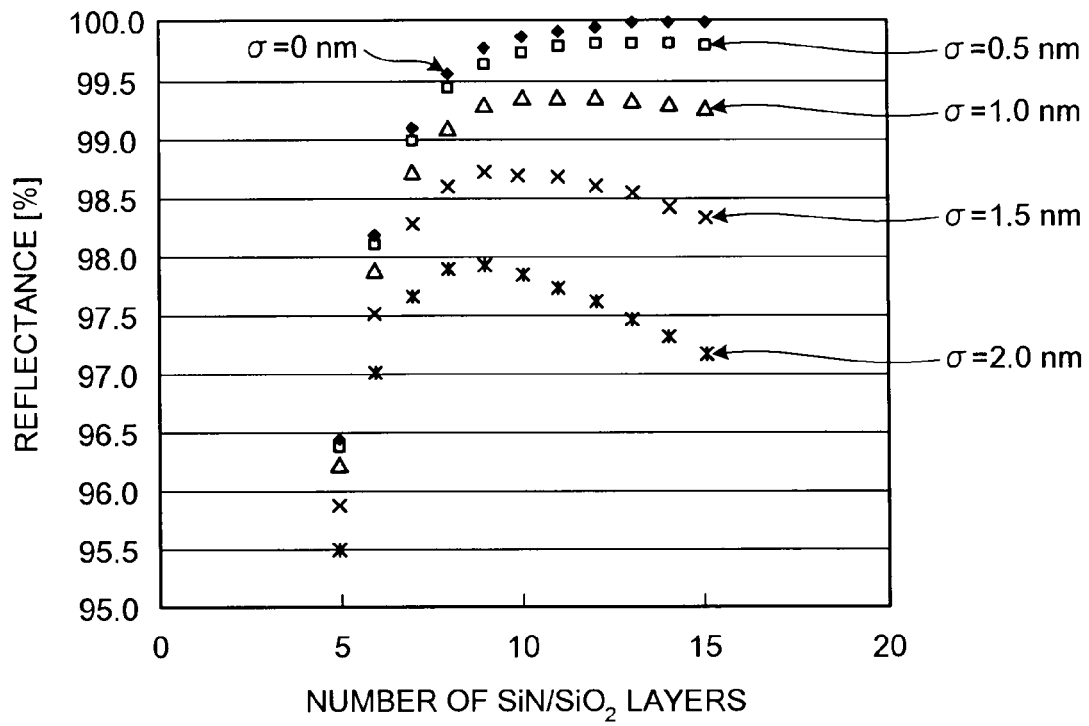
FIG. 3 is a graph for explaining reflectance and the number of $SiN/SiO_2$ layers forming an upper DBR mirror at various values of surface roughness the $SiN/SiO_2$ layers.

FIG. 3 is a graph for explaining the reflectance of the upper DBR mirror 7 and the number of the dielectric layers forming the upper DBR mirror 7 at various values of the surface roughness. The dielectric layers in the example shown in FIG. 3 are made of $SiN/SiO_2$. The reflectance is calculated using Equation (1) and the transfer matrix with the wavelength $\lambda$ of 1.3 micrometers.

If the surface roughness $\sigma$ is zero, i.e., each boundary between the dielectric layers is formed with an ideal mirror, which is used in the conventional technology, when the number of the $SiN/SiO_2$ layers is eleven or larger, the reflectance of the upper DBR mirror 7 reaches about 100%, i.e., the reflectance is in a saturated state. When the number of the $SiN/SiO_2$ layers is eight or smaller, the reflectance of the upper DBR mirror 7 increases by a large amount with addition of more layers. For example, when the number of the $SiN/SiO_2$ layers increases from seven to eight, the reflectance of the upper DBR mirror 7 increases from 99.1% to 99.6%. It means that if the surface roughness $\sigma$ is zero, it is impossible to obtain the reflectance of 99.1% to 99.6% suitable for a resonator used in the VCSEL element 100.

On the other hand, if the surface roughness $\sigma$ is 1.0 nanometer, when the number of the $SiN/SiO_2$ layers is eight to fifteen, the reflectance of the upper DBR mirror 7 is 99.1% to 99.6%. Moreover, when the number of the $SiN/SiO_2$ layers is eight to fifteen, the reflectance of the upper DBR mirror 7 is in the saturated state. Therefore, the reflectance of the upper DBR mirror 7 scarcely changes with increase or decrease of the number of the $SiN/SiO_2$ layers. Thus, the reflectance can stably be 99.1% to 99.4% regardless of the number of the $SiN/SiO_2$ layers.

If the surface roughness $\sigma$ is 0.5 nanometer to 2.0 nanometers, the reflectance of the upper DBR mirror 7 changes with increase or decrease of the surface roughness $\sigma$. More particularly, if the number of the $SiN/SiO_2$ layers is eight to fifteen and the surface roughness $\sigma$ is 0.5 nanometer to 1.0 nanometer, then the reflectance of the upper DBR mirror 7 can be 99.1% to 99.8%, which means that it is possible to obtain the reflectance suitable for a resonator used in the VCSEL element 100.

In the VCSEL element 100, the upper DBR mirror 7 is formed such that each boundary between the dielectric layers has the substantially same surface roughness $\sigma$ that is decided based on the target reflectance of the upper DBR mirror 7, the number of the dielectric layers, and the optical constants. Thus, the upper DBR mirror 7 obtains the target reflectance suitable for a resonator, and thereby the VCSEL element 100 obtains the desired laser output characteristics.

Although the upper DBR mirror 7 is formed with a plurality of dielectric layers of $SiN/SiO_2$ in the above description, various combinations of materials such as $Si/SiO_2$ can be used as the dielectric layers.

Figure 4:
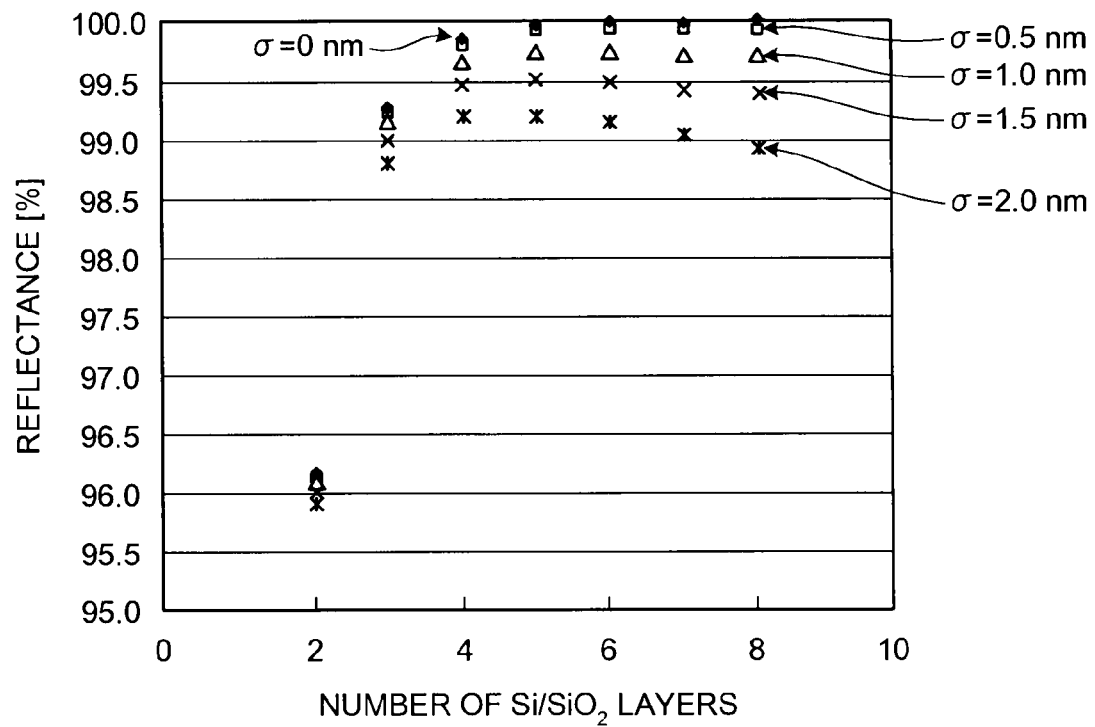
FIG. 4 is a graph for explaining reflectance and the number of $Si/SiO_2$ layers forming an upper DBR mirror at various values of the surface roughness the $Si/SiO_2$ layers.

FIG. 4 is a graph for explaining the reflectance of the upper DBR mirror 7 and the number of the dielectric layers forming the upper DBR mirror 7 at various values of the surface roughness. The dielectric layers in the example shown in FIG. 4 are made of $Si/SiO_2$. The graph shown in FIG. 4 is obtained under the same conditions under which the graph shown in FIG. 3 is obtained, except for the optical constants of the dielectric layers. It can be found that the similar effects obtained when the $SiN/SiO_2$ layers are used can be obtained with the $Si/SiO_2$ layers. More particularly, it is possible to obtain preferable reflectance of the upper DBR mirror 7, which cannot be obtained from a mirror with no surface roughness according to a conventional technology. Moreover, the preferable reflectance can be stable regardless of the number of the $Si/SiO_2$ layers.

Strictly speaking, Equation (1) assumes that the boundaries between the dielectric layers of the upper DBR mirror 7 have one-dimensionally arranged bumps and there is no consideration about pitches between the bumps. To take the optical scattering on the boundaries in account more accurately, a finite volume method is used to calculate the reflectance of the upper DBR mirror 7 in which the bumps are randomly arranged in a two-dimensional manner on the boundaries between the dielectric layers. It is assumed that the dielectric layers forming the upper DBR mirror 7 is made of $Si/SiO_2$, and the surface roughness σ represented by the RMS roughness is 1.0 nanometer. It is found by comparing a new reflectance obtained by the finite volume method (hereinafter, "two-dimensional reflectance") with the reflectance obtained by Equation (1) (hereinafter, "one-dimensional reflectance") that when an average pitch on the boundary is 300 nanometers or smaller, the scattering slightly affects the two-dimensional reflectance. The influence becomes smaller as the average pitch increases. When the average pitch is about 1000 nanometers or larger, the two-dimensional reflectance agrees with the one-dimensional reflectance. For example, the one-dimensional reflectance is 99.35% under the given conditions. When the two-dimensional reflectance is calculated under the same conditions assuming that the pitch is 300 nanometers, the two-dimensional reflectance is 99.20%, i.e., slightly lower than the one-dimensional reflectance by 0.15%.

Given below is an explanation about a method of fabricating the VCSEL element 100. The lower DBR mirror 2 and the n-type cladding layer 3 are sequentially formed on the substrate 1. The active layer 4, the current confinement layer 5, and the p-type cladding layer 6 are then sequentially formed as the mesa post 10. The p-type electrode 8 is formed on the p-type cladding layer 6. After that, the upper DBR mirror 7 is formed by forming a plurality of dielectric layers to cover the mesa post 10.

In the process of forming the upper DBR mirror 7, the surface roughness that is decided based on a target reflectance of the upper DBR mirror 7 for the laser light emitted from the VCSEL element 100 is formed on the boundaries between the dielectric layers so that the upper DBR mirror 7 can obtain the target reflectance. The surface roughness is decided based on the target reflectance of the upper DBR mirror 7, the number of dielectric layers, and the optical constants. The decided surface roughness is formed on the boundaries between the dielectric layers so that the boundaries can obtain the substantially same surface roughness. The target reflectance of the upper DBR mirror 7 is a value in the saturated state with respect to the number of the dielectric layers forming the upper DBR mirror 7.

It is preferable to form the dielectric layers by, for example, a plasma chemical vapor deposition (PCVD) at relatively low temperature (substrate temperature) of about 200° C. to form the surface roughness on the boundaries between the dielectric layers. In this manner, the dielectric layers having the surface roughness can be formed by a single process without performing an additional process. Another method can be used to form the surface roughness such as an ion-beam evaporation or an ion-beam assisted evaporation.

Although the surface roughness is formed on each of the boundaries between the dielectric layers according to the present embodiment, the surface roughness can be formed on at least one of the boundaries so that the upper DBR mirror 7 can obtain the target reflectance. More particularly, the surface roughness decided by the target reflectance of the upper DBR mirror 7 is formed on at least one of the boundaries between the dielectric layers so that the upper DBR mirror 7 can obtain the target reflectance.

As described above, according to an aspect of the present invention, it is possible to obtain a VCSEL element suitable for a device used in the field of optical interconnections or optical communications.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A surface emitting laser element comprising:
   an active layer; and
   at least one dielectric multilayer mirror formed of a structure including repetition of pairs of dielectric layers, dielectric layers in each pair of the pairs of dielectric layers comprising layers of different dielectric materials and having different refractive indices for reflecting a light generated in the active layer, wherein
   at least one of boundaries between the dielectric layers is formed to have a predetermined surface roughness to obtain a desired target reflectance of the dielectric multilayer mirror,
   the dielectric multilayer mirror is employed as at least one of an upper mirror or a lower mirror of the surface emitting laser element, and
   the desired target reflectance has a value between reflectances calculated from the structure including repetition of pairs of dielectric layers having inherent reflectances wherein
   the surface roughness is decided based on the target reflectance, number of dielectric layers, and optical constants of the dielectric layers,
   the surface roughness is 0.5 nanometer to 2.0 nanometers represented by root-mean-squared roughness.

2. The surface emitting laser element according to claim 1, wherein the target reflectance is in a saturated state with respect to the number of dielectric layers.

3. A method of fabricating a surface emitting laser element that includes an active layer and at least one dielectric multilayer mirror, each of which being formed of a structure including repetition of pairs of dielectric layers, dielectric layers in each pair of the pairs of dielectric layers comprising layers of different dielectric materials and having different refractive indices for reflecting a light generated in the active layer, the method comprising:
   forming a predetermined surface roughness on at least one of boundaries between the dielectric layers to obtain a desired target reflectance of the dielectric multilayer mirror, wherein
   the dielectric multilayer mirror is employed as at least one of an upper mirror or a lower mirror of the surface emitting laser element, and
   the desired target reflectance has a value between reflectances calculated from the structure including repetition of pairs of dielectric layers having inherent reflectances wherein
   the surface roughness is decided based on the target reflectance, number of dielectric layers, and optical constants of the dielectric layers.

4. The method according to claim 3, wherein the target reflectance is in a saturated state with respect to the number of dielectric layers.

* * * * *